US008526698B2

(12) United States Patent
Degani et al.

(10) Patent No.: US 8,526,698 B2
(45) Date of Patent: Sep. 3, 2013

(54) METHOD AND APPARATUS FOR DUCTAL TUBE TRACKING IMAGING FOR BREAST CANCER DETECTION AND DIAGNOSIS, AND PRODUCT

(75) Inventors: Hadassa Degani, Rehovot (IL); Erez Eyal, Rehovot (IL)

(73) Assignee: Yeda Research & Development Co. Ltd., Rehovot (IL)

( * ) Notice: Subject to any disclaimer, the term of this patent is extended or adjusted under 35 U.S.C. 154(b) by 228 days.

(21) Appl. No.: 12/936,940

(22) PCT Filed: Apr. 14, 2009

(86) PCT No.: PCT/US2009/040423
§ 371 (c)(1),
(2), (4) Date: Oct. 8, 2010

(87) PCT Pub. No.: WO2009/129200
PCT Pub. Date: Oct. 22, 2009

(65) Prior Publication Data
US 2011/0038521 A1    Feb. 17, 2011

Related U.S. Application Data

(60) Provisional application No. 61/044,697, filed on Apr. 14, 2008.

(51) Int. Cl.
*G06K 9/00*    (2006.01)

(52) U.S. Cl.
USPC ............................. 382/131; 382/128

(58) Field of Classification Search
USPC ............ 382/100, 103, 128–131, 162–167, 382/252, 275; 128/922
See application file for complete search history.

(56) References Cited

U.S. PATENT DOCUMENTS

| | | | |
|---|---|---|---|
| 5,709,206 A * | 1/1998 | Teboul | 600/437 |
| 6,526,305 B1 | 2/2003 | Mori | |
| 7,190,829 B2 * | 3/2007 | Zhang et al. | 382/165 |
| 7,366,564 B2 * | 4/2008 | Szu et al. | 600/473 |

OTHER PUBLICATIONS

International Search Report published Oct. 22, 2009 for PCT/US2009/040423, filed Apr. 14, 2009.
International Preliminary Report on Patentability published Oct. 19, 2010 for PCT/US2009/040423, filed Apr. 14, 2009.

(Continued)

*Primary Examiner* — Shefali Goradia
(74) *Attorney, Agent, or Firm* — Fleit Gibbons Gutman Bongini & Bianco PL; Martin Fleit; Paul D. Bianco

(57) ABSTRACT

A method apparatus and computer product for imaging a human breast to map the breast ductal tree is disclosed. First, a breast is diffusion tensor imaged with high spatial resolution. Then the breast ductal tree is tracked using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression. The diffusion tensor is calculated by a non-linear best fit algorithm and then diagonalized with principal component analysis to three eigen vectors and their corresponding eigen values. A vector field map is obtained for tracking of breast ducts of the ductal trees along the direction of the $1^{st}$ eigenvector $v_1$ and the ductal tree is displayed on a voxel by voxel basis in parametric images using color coding and vector pointing.

18 Claims, 11 Drawing Sheets

(56) References Cited

OTHER PUBLICATIONS

Written Opinion published Oct. 14, 2010 for PCT/US2009/040423, filed Apr. 14, 2009.
S.C. Partridge et al, "Diffusion Tensor Imaging of the Breast: Preliminary Clinical Findings" Proc. Intl. Soc. Mag. Reson. Med. vol. 14 (2006), p. 2902.
Marini et al. "Quantitative diffusion-weighted MR imaging in the differential diagnosis of breast lesion." European Journal of Radiology 17-2646-2655, Mar. 14, 2007.
Le Bihan et al. "Diffusion Tensor Imaging: Concepts and Applications." Journal of Magnetic Resonance Imaging 13:534-546 Apr. 1, 2001.

* cited by examiner

Data Processing

Diffusion indexes and vector maps

DWI b=0 sec/mm2
52 slices

DWI b=700 sec/mm2
52 slices * 64 directions

Non Linear Fitting
$\ln(S/S_o) = -bD$

Diffusion tensor $$D = \begin{bmatrix} D_{xx} & D_{xy} & D_{xz} \\ D_{yx} & D_{yy} & D_{yz} \\ D_{zx} & D_{zy} & D_{zz} \end{bmatrix}$$

FIG. 2 b – b value (700sec/mm2)
S – signal with diffusion gradient
S0 – signal with no diffusion gradient
* The calculations are per voxel

Principal Component Analysis $$D = \begin{bmatrix} D_{xx} & D_{xy} & D_{xz} \\ D_{yx} & D_{yy} & D_{yz} \\ D_{zx} & D_{zy} & D_{zz} \end{bmatrix}$$

Principal Component Analysis (PCA)

$\lambda_1, \lambda_2, \lambda_3$ Magnitude
$v_1, v_2, v_3$ Direction

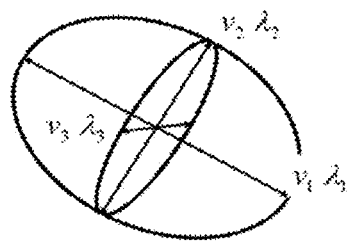

FIG. 3

Measuring diffusion using 64 directions

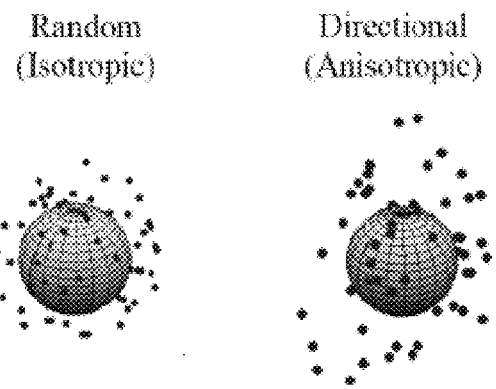

Random (Isotropic)    Directional (Anisotropic)

FIG. 4

Standard Diffusion Parameters
for anisotropic motion

Fractional Anisotropy (FA)

$$FA = \frac{\sqrt{3[(\lambda_1 - \langle\lambda\rangle)^2 + (\lambda_2 - \langle\lambda\rangle)^2 + (\lambda_3 - \langle\lambda\rangle)^2]}}{\sqrt{2(\lambda_1^2 + \lambda_2^2 + \lambda_3^2)}}$$

0 ←——— FA ———→ 1
Isotropic            Maximal anisotropy $ADC = (\lambda_1 + \lambda_2 + \lambda_3)/3$

FIG. 5

Diffusion properties of different breast tissues

|  | ADC | $\lambda_3 - \lambda_1$ mm2/sec | $\lambda_1$ mm2/sec | $v_1$ |
|---|---|---|---|---|
| Cancer | Low | Low | Low | Random |
| Normal tissue | High | High Negative | High | Directional |
| Cyst | High | Low | High | Random |

FIG. 6

Median values for all volunteers calculated for the fibro-glandular ROI

| | $\lambda_1$ $10^{-3} mm^2/sec$ | $\lambda_3 - \lambda_1$ $10^{-3} mm^2/sec$ | FA | ADC $10^{-3} mm^2/sec$ |
|---|---|---|---|---|
| 1 | 2.1 | -0.8 | 0.24 | 1.7 |
| 2 | 2.3 | -0.5 | 0.12 | 2.1 |
| 3 | 1.6 | -0.6 | 0.25 | 1.3 |
| 4 | 2.3 | -0.6 | 0.17 | 2.0 |
| 5 | 2.0 | -0.6 | 0.20 | 1.6 |
| 6 | 2.2 | -0.7 | 0.22 | 1.8 |
| 7 | 2.2 | -0.7 | 0.20 | 1.8 |
| 8 | 1.7 | -0.7 | 0.26 | 1.4 |
| 9 | 2.2 | -0.5 | 0.13 | 1.9 |
| 10 | 2.4 | -0.7 | 0.18 | 2.1 |
| 11 | 2.0 | -0.7 | 0.24 | 1.6 |
| 12 | 2.0 | -0.7 | 0.24 | 1.6 |
| 13 | 2.2 | -0.5 | 0.14 | 1.9 |
| 14 | 1.8 | -0.7 | 0.25 | 1.4 |
| 15 | 2.1 | -0.8 | 0.25 | 1.6 |
| 16 | 2.1 | -0.8 | 0.23 | 1.7 |
| 17 | 2.2 | -0.7 | 0.20 | 1.8 |
| Mean | 2.1 | -0.7 | 0.21 | 1.7 |
| std | 0.22 | -0.1 | 0.05 | 0.23 |
| Normalized std (std/mean) | 0.1 | -0.15 | 0.22 | 0.14 |

FIG. 7

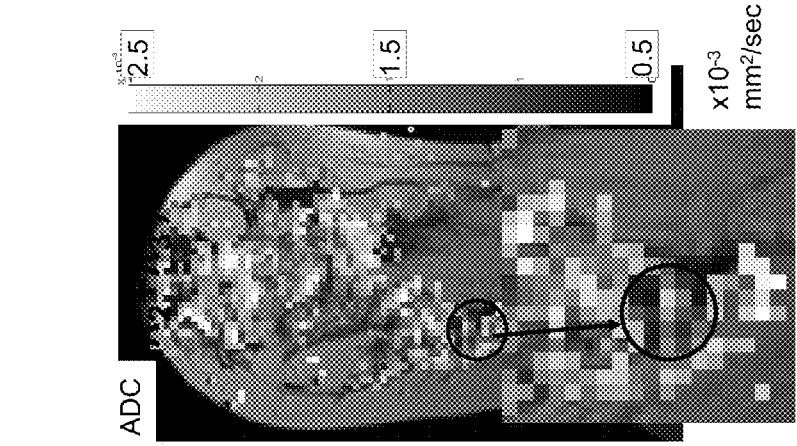
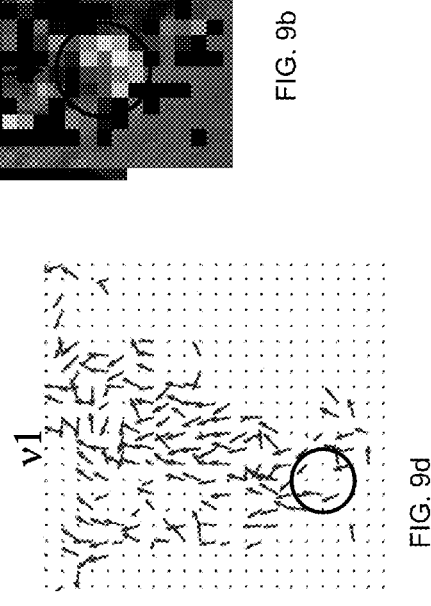
FIG. 9a  FIG. 9b  FIG. 9c  FIG. 9d

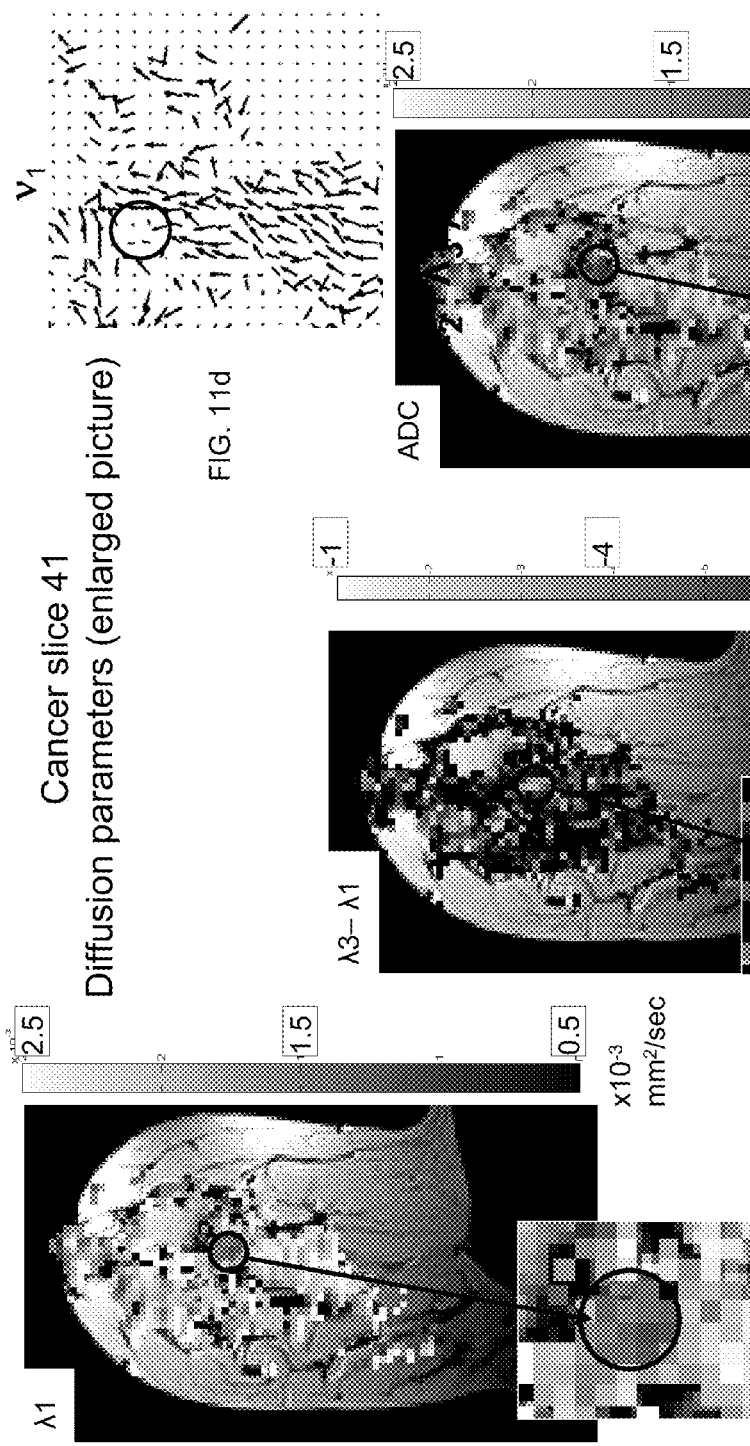

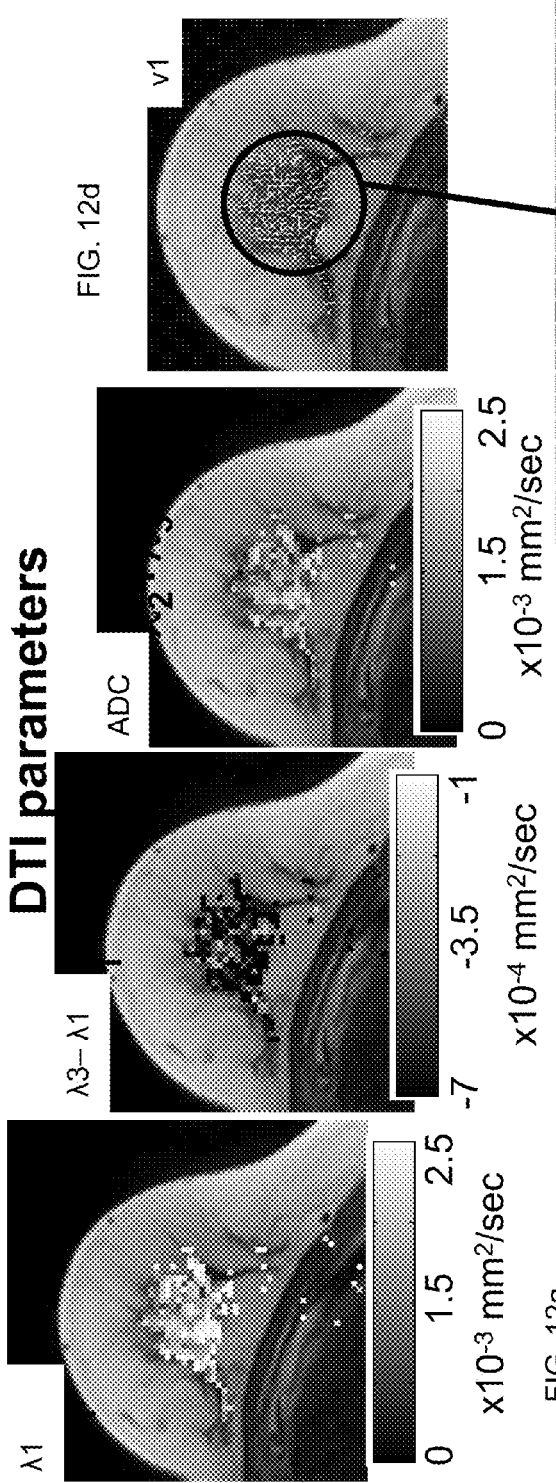
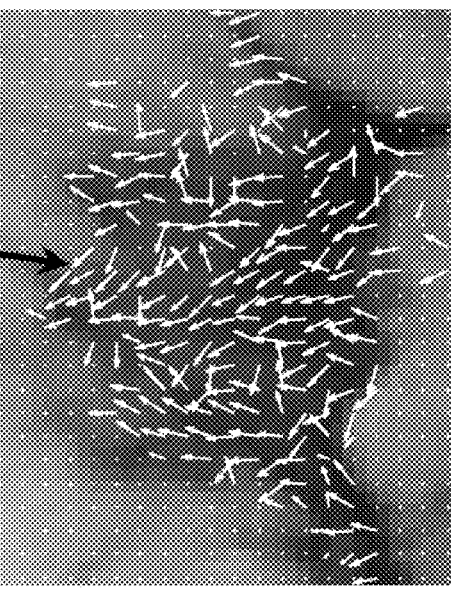
Volunteer (eg795) – normal breast, DTI parameters
FIG. 12a  λ1
FIG. 12b  λ3−λ1
FIG. 12c  ADC
FIG. 12d  v1
FIG. 12e

T2 WEIGHTED IMAGE

EXAMPLES OF CYSTS IN THE BREAST

DTI parameters of the cyst

METHOD AND APPARATUS FOR DUCTAL TUBE TRACKING IMAGING FOR BREAST CANCER DETECTION AND DIAGNOSIS, AND PRODUCT

BACKGROUND OF THE INVENTION

1. Field of the Invention

The invention relates to a method for ductal tube tracking imaging for breast cancer detection and imaging, to an apparatus for ductal tube tracking, and to products comprising a computer readable medium comprising programs that includes displaying ductal tube images.

2. Prior Art

The two leading methods for screening the female population and detect breast cancer are currently high-quality X-ray mammography and breast ultrasound. The sensitivity of mammography has been estimated to be 63-88% and is lower by 10% or more for women aged 40-49 years and in older women using hormonal replacement therapy (HRT) than it is for other older women (Laya M B, Larson E B, Taplin S H, et al.: Effect of estrogen replacement therapy on the specificity and sensitivity of screening mammography. Journal of the National Cancer Institute 88(10): 643-649, 1996; and Persson I, Thurfjell E, Holmberg L: Effect of estrogen and estrogen-progestin replacement regimens on mammographic breast parenchymal density. Journal of Clinical Oncology 15(10): 3201-3207, 1997). Efforts to improve mammography focus on developing and applying digital mammography, however, X-ray mammography suffers from several limitations in addition to the use of ionizing radiation (albeit at low dose).

Ultrasound has NO hazard radiation exposure, however, it is used as an adjunct method to mammography and not for routine breast cancer screening because it does not consistently detect certain early signs of cancer.

Breast MRI studies were first applied in the 1980s and were based on the contrast provided by T1 and T2 nuclear relaxation processes of the tissue water (Yousef S J E, Duchesneau R H, Alfidi RJ, et al. Magnetic resonance imaging of the breast. Radiology 150: 761-6, 1984; Partain C L, Kulkarni M V, Price R R, et al. Magnetic resonance imaging of the breast: functional T1 and three-dimensional imaging. Cardiovasc Intervent Radiol 8: 292-9, 1986; and Santyr G E. MR imaging of the breast. Magn Res Imag Clin North Am 2: 673-90, 1994). The contrast achieved by these mechanisms was not sufficient for discriminating between the normal fibroglandular tissue and breast lesions (benign and malignant), except for T2 contrast that clearly identified fluid cysts.

Subsequent studies of contrast enhanced MRI using gadolinium based contrast agents, demonstrated the capability to sharply delineate breast lesions. Currently, the standard protocol for breast cancer detection by MRI is based on dynamic contrast-enhanced (DCE) MRI, originally suggested by Kaiser and Zeitler (Kaiser W A, Zeitler E. MR imaging of the breast: fast imaging sequences with and without Gd-DTPA. Preliminary observations. Radiology 170: 681-686, 1989).

The applicant and co-workers have been involved for the last 15 years in investigating the pathophysiological basis of DCE-MRI in breast cancer animal models and in humans, developing new protocols and image processing algorithms for improving breast cancer diagnosis, see i. Furman-Haran E, Margalit R, Grobgeld D and Degani H, "Dynamic Contrast Enhanced Magnetic Resonance Imaging Reveals Stress Induced Angiogenesis in MCF7 Human Breast Tumors" Proc. Natl. Acad. Sci. USA, 93: 6247-6251, 1996.

ii. Degani H, Gusis V, Weinstein D, Fields S, Strano S. Mapping pathophysiological features of breast tumors by MRI at high spatial resolution. Nat Med. 3(7): 780-2, 1997.

iii. Furman Haran E, Grobgeld D, and Degani H, Dynamic Contrast Enhanced Imaging and Analysis at High Spatial resolution of MCF7 Human breast Tumors J. Magn. Reson. 128: 161-171, 1997.

iv. Furman-Haran E, Grobgeld D, Degani H, Decreased cellular volume fraction and increased microvascular permeability indicate response of MCF7 xenografts to tamoxifen; application of the 3 time point contrast enhanced MRI method, Clinical Cancer Research, 4: 2299-2304, 1998.

v. Weinstein D, Strano S, Cohen P, Fields S, Gomori J M, Degani H. Breast fibroadenoma: mapping of pathophysiologic features with three-time-point, contrast-enhanced MR imaging—pilot study. Radiology. 210(1): 233-40, 1999.

vi. Furman-Haran E, Grobgeld D, Kelcz F, Degani H. Critical role of spatial resolution in dynamic contrast-enhanced breast MRI. J Magn Reson Imaging. 13(6): 862-7, 2001.

vii. Kelcz F, Furman-Haran E, Grobgeld D, Degani H. Clinical testing of high-spatial-resolution parametric contrast-enhanced MR imaging of the breast. AJR Am J. Roentgenol. 179(6): 1485-92, 2002.

viii. Furman-Haran E, Schechtman E, Kelcz F; Kirshenbaum K, and Degani H. MRI Reveals Functional Diversity of the Vasculature in Benign and Malignant Breast Lesions. Cancer, 15; 104(4): 708-18, 2005.

ix. Eyal E, Furman-Haran F, Badikhi D, Kelcz F, and Degani H. Combination of model-free and model-based analysis of dynamic contrast enhanced MRI for breast cancer diagnosis Proc. SPIE Vol. 6916, 69161 B, Mar. 12, 2008.

x. Eyal E, Degani H. Model-based and model-free parametric analysis of breast dynamic-contrast-enhanced MRI. NMR Biomed, 22(1): 40-53, 2009.

Despite the very high sensitivity of DCE-MRI, this procedure is not used for routine breast cancer screening, most likely because of its relatively high costs and significant false positive rates (which varies between different centers due to lack of standardization). In addition, as gadolinium-based contrast agents may trigger the development of nephrogenic systemic fibrosis (NSF) in patients with renal failure (Grobner T, Gadolinium—a specific trigger for the development of nephrogenic fibrosing dermopathy and nephrogenic systemic fibrosis? Nephrol Dial Transplant 21: 1104-108, 2006), the accumulated risk of gadolinium based contrast agents to induce NSF presents a limitation in using it for breast cancer screening (Thomsen HS, Marckmann P, Logager VB 9: Update on nephrogenic systemic fibrosis Magn Reson Imaging Clin N Am. 16(4): 551-60, vii 2008; and Broome DR. Nephrogenic systemic fibrosis associated with gadolinium based contrast agents: a summary of the medical literature reporting. Eur J Radiol. 66(2):230-4, 2008).

More recently a new MRI approach based on contrast provided by the self diffusion of water in tissues, or through parameterization of the apparent diffusion coefficient (ADC) has been proposed for the detection of breast cancer. Applicants have previously investigated the extracellular and intracellular diffusion characteristics in the different micro-environments of human breast cancers implanted in nude mice. Due to the high cell density in proliferating cancer regions, the cancer tissue exhibited a lower ADC in the extracellular compartment (median value of $1.0 \times 10^{-3}$ mm$^2$/s$\times 10^{-3}$) as compared to water ADC, similar to the values found in breast cancer patients, whereas the intracellular ADC was further lower by one order of magnitude as a result of the more complex intracellular milieu and the restriction by the cells' membrane. The clinical studies showed significant differences between the mean ADC of cancers, benign lesions and normal breast tissue, however, a large overlap was exhibited between the individual ADC values of the various normal and abnormal breast tissue. It has been thus concluded that mapping the apparent diffusion coefficients may provide an adjunct method to the common contrast enhanced MRI method for breast cancer diagnosis.

It is well established that mammary malignancies originate in the epithelial tissues of the ducts, and spread along ducts. Even when the cells are invasive and outgrow the ducts, the ductal spread will still be extensive. Consequently, the ductal structures are an imperative area of investigation of malignant breast transformation.

Current knowledge of the structural features of the ductal system was initially discovered by Sir Astley Cooper in 1840 by duct injection studies in women who died during lactation. In this studies it was revealed that human breast tissue is organized into separate lobes, each composed of one central duct, its peripheral branches and their associated glandular tissues. This architecture is very challenging to study in its entirety: whole-breast ductal trees mapping has only been achieved for two ex vivo human breasts and on two anatomical studies of breast mastectomy specimens (Moffat D F, Going J J, Three dimensional anatomy of complete duct systems in human breast: pathological and developmental implications. J Clin Pathol 49:48-52, 1996; and Ohtake T, Kimijima I, Fukushima T, Yasuda M, Sekikawa K, Takenoshita S, Abe R: Computer-assisted complete three dimensional reconstruction of the mammary ductal/lobular systems: implications of ductal anastomoses for breast-conserving surgery. Cancer 91: 2263-2272, 2001). Moffat and Going reported 3D computer model based on sub-macroscopic coronal slices of an autopsy breast. Ohtake et al applied computer simulations based on surgical quadrantectomies to analyze ductal anatomy. Increasing interest in the intraductal approach for breast cancer treatment led Love and Barsky (Love S M, Barsky S H, Anatomy of the nipple and breast ducts revisited. Cancer, 101: 1947-1957, 2004) to review a large series of ductograms showing that more than 90% of all nipples examined contained 5-9 ductal orifices, generally arranged as a central group and a peripheral group. Each nipple orifices communicated with a separate non-anastomosing ductal system, which extended to the terminal duct lobular unit. Going and Moffat (Going J J, Moffat D F, Escaping from Flatland: clinical and biological aspects of human mammary duct anatomy in three dimensions. J Pathol 2004: 203:538-544) investigated the number of milk collecting ducts in excised nipples, and the 3D structure of the collecting ducts, as well as the volume of all duct trees (lobes). Their results indicated three distinct nipple duct populations with diversity in the number of nipple central ducts and in the volumes of the lobes. Overall, however, these independent studies were contradictory in the number of ductal orifices, the number of different ductal trees and the presence of anastomoses among different ductal trees.

None of the available imaging methods employed today has succeeded in tracking the entire ductal system of the breast in vivo, although this significant challenge has been realized, and initial ultrasound studies of the lactating breast (Ramsay D T, Kent J C, Hartmann R A, Hartmann P E: Anatomy of the lactating human breast redefined with ultrasound imaging. J Anatomy 206: 525-534, 2005), as well as detection of sectional ductal structures using second-order shape measurements were performed (Gooding M J, Mellor m, Shipley J A, Broadbent K A, Goddard D A, Automatic mammary duct detection in 3D ultrasound, Med Image Compute Assist Intern Into Conf Med Image Compute Compute Intersv 8: 43441, 2005). The ability to measure water self diffusion by MRI and to track anisotropic water movement has been known for decades (Gooding M J, Mellor m, Shipley J A, Broadbent K A, Goddard D A, Automatic mammary duct detection in 3D ultrasound, Med Image Compute Assist Intern Into Conf Med Image Compute Compute Intersv 8: 43441, 2005; and Stejskal E O, and Tanner J E, Spin diffusion measurements: spin echoes in the presence of a time dependent field gradient, J Chem Phys 42: 288-292, 1965), and it was successfully applied for tracking fibers in the brain, as well as helping diagnose a range of brain abnormalities.

SUMMARY OF THE INVENTION

The present invention relates to a novel method and apparatus for ductal tube tracking imaging for breast cancer screening and detection and diagnosis and products. To the best of applicants' knowledge, this invention is the first to propose tracking the breast ductal trees by diffusion tensor imaging in order to identify changes in the water diffusion tensor; namely the direction, anisotropy and diffusion coefficients due to malignant growth in the ducts.

The method of the present invention is based a new MRI approach that consists of tracking the anisotropic water diffusion in the mammary ductal trees through measurements of the water diffusion tensor at high spatial resolution for the detection of breast cancer. The method is predicated on tracking the anisotropic water diffusion in the mammary ductal trees through measurements of the water diffusion tensor at high spatial resolution, and subsequently processing the obtained datasets in a unique and novel manner. This method is exclusively non-invasive and non-hazardous (no use of contrast agents).

The functional breast tissue is composed of many lobes, which are highly variable in size and shape. Each lobe has one central duct with its peripheral branches forming a ductal tree and their associated glandular tissues. This architecture is very challenging to study in its entirety; thus far whole-breast lobe mapping has only been achieved for two human breasts using, ex-vivo, sliced tissue. Currently, no imaging method has succeeded in tracking the full ductal system in vivo.

The water movement inside the ductal trees is anisotropic, namely, water diffuses faster along the direction of the ducts (parallel to the ducts' walls) than in the orthogonal directions. The method of the present invention tracks anisotropic movement in the fibroglandular breast tissue using 3-dimensional diffusion tensor MRI, and thereby provides a means for mapping the ductal trees in the entire breast in vivo.

Moreover, since mammary malignancies originate in the epithelial tissues of the ducts, and spread inside the ducts, along ducts and consequently may outgrow the ducts, the invention postulates that the water diffusion in ducts with malignant growth will loose its anisotropic nature and will slow down due to the higher cell density as compared to the free water movements in the ducts. This change in the water diffusion characteristics can be detected by the method of the present invention using the above mentioned 3-dimensional diffusion tensor MRI and provide a means for the detection of breast cancer.

The invention further postulates that water diffusion in benign breast lesions differs from water anisotropic diffusion in the normal fibroglandular tissue of the breast, as well as from water diffusion characteristics of cancer growth. The origin of benign lesions can be stromal (fibroadenoma), or ductal (most fibrocystic changes), and hence, the changes in water diffusion characteristics will depend on the morphologic structure and cellular arrangement in each type of benign lesion. The method of the present invention can detect benign lesions on the basis of the changes in the water diffusion tensor as measured by MRI. For example, pericanalicular fibroadenoma will maintain the ductal anisotropy, but the apparent diffusion coefficient will be affected by the extracellular properties of fibrous tissue. Intracanalicular fibroadenoma, particularly of the "old" nature will loose anisotropy and exhibit a relatively high apparent diffusion coefficient due to low cellularity. Clearly the changes in the diffusion characteristics of each type of benign lesion can be characterized and detected by the method of the present invention. It is believed that subsequent clinical trials to assess the diagnostic ability will show the viability of this novel method.

Another aspect of the invention concerns changes in the diffusion tensor in response to therapy. Success of therapy leads to tumor regression and the replacement of tumor tissue by stromal repair tissue with no regeneration of ducts. Consequently, success of treatment may not significantly change the diffusion anisotropy (although small variations may exist between fast growing stromal tissue and epithelial cancerous tissue), but may significantly modify the apparent diffusion coefficient according to the changes in the cellular and morphological characteristics of the tissue.

The principal object of the present invention is to provide a novel method for tracking the ductal trees in the entire breast in vivo, and measure the water diffusion characteristics of the breast fibroglandular tissue and of breast lesions, and to map or display the datasets in a unique and novel way. This is carried out by mapping at high resolution the anisotropic water diffusion characteristics as the basis for the detection and diagnosis of breast cancer, as well as, monitoring response to therapy.

Further objects of the present invention include a method for an optimized protocol for high spatial resolution diffusion tensor imaging of the two breasts; apparatus for image processing that tracks the ductal trees of the breast and maps the distinct diffusion parameters at 2 and 3 dimensions; a method to identify age dependent changes and hormonal induced changes in the diffusion characteristics of the fibroglandular breast tissue; a method for characterizing using diffusion tensor imaging (DTI) to determine the changes in the diffusion characteristics and of breast malignancies; a method for determining via DTI the changes in the diffusion characteristics of breast benign diseases; and a method for determining using DTI the changes in diffusion characteristics in patients with high grade cancers undergoing neoadjuvant chemotherapy.

One of the essential contributions of the present invention is to enable 3-D tracking of mammary ducts using Diffusion Tensor MRI. To this end, applicants have developed a novel inventive method for a 3-dimensional magnetic resonance diffusion tensor imaging (MR-DTI) for tracking the tree of the ductal system, based on sampling the anisotropic water diffusion along the mammary ductal tube network. The method is based on the fact that the water diffuses faster along the ducts than orthogonal to them, thus exhibiting anisotropy which is detected by high spatial resolution diffusion tensor imaging.

This is a new method for imaging the two breasts simultaneously to determine the breast ductal tubes and for detecting breast cancer. This method does not require injection of a contrast agent like the current leading MRI method for breast cancer detection. It is primarily directed towards developing MRI for screening to replace mammography screening. MRI has been applied previously to track fibers in the brain and in muscle tissue, but not in ductal breast tubes or other body tubes, which is a different application. The fact that a contrast agent is not necessary makes this inventive method purely non-invasive, non hazardous, less expensive and shorter in time. Consequently, the reduction of the costs and elimination of the discomfort and risk of contrast injection makes it much more practical for improving breast screening, particularly of high risk patients. By tracking the diffusion tensor in the ductal trees of the breast in vivo according to the present invention it should be possible to identify malignant growth in the ducts at early stages. The novel 3-dimensional magnetic resonance diffusion tensor imaging (MR-DTI) method for tracking the ductal systems (ductal trees), in the entire breast, based on sampling the water anisotropic diffusion along the mammary ductal network enables the foregoing. Any cancer growth in the ducts will modify this anisotropic water diffusion causing changes in both the diffusion direction and diffusion coefficient in each direction that will be detected by the method and apparatus of the present invention.

The invention provides an optimized protocol for high spatial resolution diffusion tensor imaging of the two breasts using echo-planar imaging (EPI) diffusion, and enables the presentation of final parametric images in the most revealing way for identifying breast abnormal tissue. The optimization of the protocol includes the diffusion weightings (b values), the number of non collinear directions ($n \geq 6$) for tensor calculations, the diffusion time and echo time, as well as the spatial resolution, signal to noise, and scanning time. Following calculation of the diffusion tensor, pixel by pixel, and diagonalizing the tensor to obtain the corresponding eigen values and eigenvectors per pixel reveals the anisotropy indices. Displaying the eigen values and their combination as parametric images and the prime eigenvector for vector presentation and ductal tracking shows the utility of the invention. The ability of DTI to track for the first time the ductal trees in the entire breast in vivo presents a revolutionized step forward and provides novel means for the detection, diagnosis and management of breast cancer patients.

The method and apparatus use high spatial resolution DTI of the two breasts to map the ductal trees. Special algorithms have been developed for tracking the breast ductal tree. Specifically, a protocol has been designed for breast echo-planar imaging (EPI) diffusion, optimizing the diffusion weightings (b values), the number of non-collinear directions for tensor calculations, diffusion, echo and repetition times, as well as the spatial resolution, signal to noise, and scanning time. Following calculation of the diffusion tensor, using novel algorithms, the characteristic parameters are derived, such as, the ADCs and the diffusion anisotropy indices. The tracking of the ducts along the direction of greatest diffusion was performed by diagonalizing the tensor and determining the direction of the principal eigen-vector using principal component analysis. The display of the ductal tree on a voxel by voxel basis is performed using color coding and vector pointing.

Tracking of water diffusion along the axis of each duct for clinical analysis detects anomalous changes due to tumor development and provides a non-invasive breast screening method free of injecting a contrast agent. This method can be employed to detect and define the growth of DCIS along breast ducts and the interruption of the ductal structures by infiltrating ductal carcinoma. It may also provide a tool for assessing the feasibility of gaining access to the breast parenchyma for therapy via duct openings starting at the nipple. In summary, this method is directed towards achieving an ultimate non invasive method for breast cancer screening and diagnosis.

The method can be adapted to any MRI scanner (field 1.5 T and higher) with a dedicated breast coil. Actual MR-DTI measurements were performed on a 3 Tesla whole body scanner equipped with a transmitting body coil and a receiving, 4-channel phased array, breast coil.

A principal object of the invention is to provide a method for imaging a human breast to map the breast ductal tree comprising the steps of:
a) diffusion tensor imaging of a breast with high spatial resolution;
b) tracking the breast ductal tree using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression;
c) calculating the diffusion tensor by a non-linear best fit algorithm;
d) diagonalizing with principal component analysis to three eigen vectors and their corresponding eigen values;
e) obtaining a vector field map for tracking of breast ducts of the ductal trees along the direction of the $1^{st}$ eigenvector $v_1$ and
f) displaying the ductal tree on a voxel by voxel basis in parametric images using color coding and vector pointing.

The inventive method can image the human's two breasts simultaneously. Also, the method can image utilizing as a diffusion parameter for detection of breast cancer at least one of the eigenvalues $\lambda_1$ and $(\lambda_3-\lambda_1)$. Further the method can image utilizing as a diffusion parameter for detection of breast cancer the eigenvalue $ADC=(\lambda_1+\lambda_2+\lambda_3)/3$. (in units of $(mm^2/sec \times 10^{-3})$ It is a further object of the invention to provide an apparatus for imaging a human breast to map the breast ductal tree comprising:
a) means for diffusion tensor imaging of a breast with high spatial resolution;
b) means for tracking the breast ductal tree using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression;
c) means for calculating the diffusion tensor by a non-linear best fit algorithm;
d) means for diagonalizing with principal component analysis to three eigen vectors and their corresponding eigen values;
e) means for obtaining a vector field map for tracking of breast ducts of the ductal trees along the direction of the $1^{st}$ eigenvector $v_1$; and
f) means for displaying the ductal tree on a voxel by voxel basis in parametric images using color coding and vector pointing.

The inventive apparatus can image simultaneously the human's two breasts. The inventive apparatus can carry out the imaging also utilizing as a diffusion parameter for detection of breast cancer at least one of the eigenvalues $\lambda_1$ and $(\lambda_3-\lambda_1)$. The inventive apparatus can carry out the imaging also utilizes as a diffusion parameter for detection of breast cancer the eigenvalue $ADC=(\lambda_1+\lambda_2+\lambda_3)/3$. (in units of $(mm^2/sec \times 10^{-3})$.

A still further object of the present invention is to provide a computer product comprising a computer readable medium containing programmed instructions for diffusion tensor imaging of a breast with high spatial resolution map the breast ductal tree; tracking the breast ductal tree using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression; calculating the diffusion tensor by a non-linear best fit algorithm; diagonalizing with principal component analysis to three eigen vectors and their corresponding eigen values; and displaying the ductal tree on a voxel by voxel basis in parametric images using color coding and vector pointing.

The inventive computer product can contain programmed instructions for simultaneously imaging the human's two breasts. The inventive computer product can contain programmed instructions for imaging also utilizing as a diffusion parameter for detection of breast cancer at least one of the eigenvalues $\lambda_1$ and $(\lambda_3-\lambda_1)$. The inventive computer product can contain programmed instructions for imaging also utilizing as a diffusion parameter for detection of breast cancer the eigenvalue $ADC=(\lambda_1+\lambda_2+\lambda_3)/3$. (in units of $(mm^2/sec \times 10^{-3})$.

A still further object of the present invention is to provide a method for imaging the human breast comprising the steps of:
a) obtaining by high spatial resolution diffusion tensor imaging of a breast or breasts to map breast ductal trees;
b) tracking breast ductal trees via a first set of algorithms using a protocol for breast based on echo-planar imaging (EPI) diffusion designed for optimizing diffusion weightings (b values), number of non-collinear directions for tensor calculations, diffusion, echo and repetition times, as well as spatial resolution, signal to noise, and scanning time and a sequence for fat suppression;
c) calculating the diffusion tensor by a non linear best fit algorithm;
d) diagonalizing with principal component analysis or equivalent algorithm this tensor to three eigen vectors and their corresponding eigen values with a first set of algorithms
e) deriving from the eigen values characteristic parameters including, ADCs and the diffusion anisotropy indices using a dedicated set of algorithms;
e) using a specific set of algorithm for deriving a vector field map for tracking of breast ducts along the direction of the eigen vector with the largest eigen value representing the largest diffusion; and
g) displaying the ductal tree on a voxel by voxel basis using color coding and vector pointing.

A further object of the present invention is to provide apparatus for imaging the human breast comprising:
a) means for obtaining by high spatial resolution diffusion tensor imaging of a breast or breasts to map breast ductal trees;
b) means for tracking breast ductal trees via a first set of algorithms using a protocol for breast echo-planar imaging (EPI) diffusion designed for optimizing diffusion weightings (b values), number of non-collinear directions for tensor calculations, diffusion, echo and repetition times, as well as spatial resolution, signal to noise, and scanning time and fat suppression sequence;
c) means for calculating the diffusion tensor using a second set of algorithms;

d) means for using principal component analysis to diagonalize the diffusion tensor and obtain three eigen vectors and their corresponding eigen values;
e) means deriving characteristic parameters including, ADCs and the diffusion anisotropy indices;
f) means for determining the direction of the principal eigenvector with largest eigen value presenting the direction of greatest diffusion;
d) means for deriving a vector field map for tracking of breast ducts along the direction of greatest diffusion; and
f) means for displaying the ductal tree on a voxel by voxel basis using color coding and vector pointing.

Another object of the invention is to provide a product comprising a computer readable medium containing programmed instructions for obtaining by high spatial resolution diffusion tensor imaging of breasts to map the breast ductal trees; tracking the breast ductal trees via a first set of algorithms using a protocol for breast echo-planar imaging (EPI) diffusion designed for optimizing diffusion weightings (b values), number of non-collinear directions for tensor calculations, diffusion, echo and repetition times, as well as spatial resolution, signal to noise, and scanning time and fat suppression sequence; calculating the diffusion tensor using non linear best fit algorithms; applying principal component analysis to diagonalize the diffusion tensor and obtain three eigen vectors and their corresponding eigen values to derive characteristic parameters including, ADCs and the diffusion anisotropy indices; deriving a vector field map for tracking of breast ducts along the direction of the principal eigen vector representing greatest diffusion; and displaying the ductal trees on a voxel by voxel basis using color coding and vector pointing.

Other and further objects and advantages of the present invention will become apparent from the following detailed description of preferred embodiment so the present invention when taken in conjunction with the appended drawings.

BRIEF DESCRIPTION OF THE DRAWINGS

FIG. 2 shows graphically the data processing for diffusion indexes and vector maps for an MRI of 52 slices and 64 directions where DWI b=0 sec/mm$^2$ and 700 sec/mm$^2$ of the novel method and apparatus;

FIG. 3 shows graphically Principal Component Analysis;

FIG. 4 shows graphically measuring diffusion using 64 directions;

FIG. 5 shows graphically standard diffusion parameters for anisotropic motion and;

FIG. 6 shows in table form diffusion properties of different breast tissues;

FIG. 7 shows in table form diffusion parameters calculated for the normal fibro-glandular tissue (n=17) according to the present invention and highlights the differences;

FIGS. 9a to 9d show the breast images of FIG. 8 in enlarged views of the parametric images and maps of slice 38 shown in FIG. 8 according to the diffusion parameters of the present invention;

FIGS. 11a to 11d show breast images of FIG. 10 in enlarged views of the parametric images and maps of slice 41 shown in FIG. 10;

FIGS. 12a to 12e shows breast images in the form of dynamic contrast enhanced MRI parametric images and maps for a normal breast of a volunteer patient (eg795) generated and representing normal breast tissue mapped according to the novel diffusion (DTI) parameters of the novel method and apparatus of the present invention;

DETAILED DESCRIPTION OF PREFERRED EMBODIMENTS OF THE INVENTION

High Level Flow Chart for DTI Mammary Ductal Tractography

Figure 1:
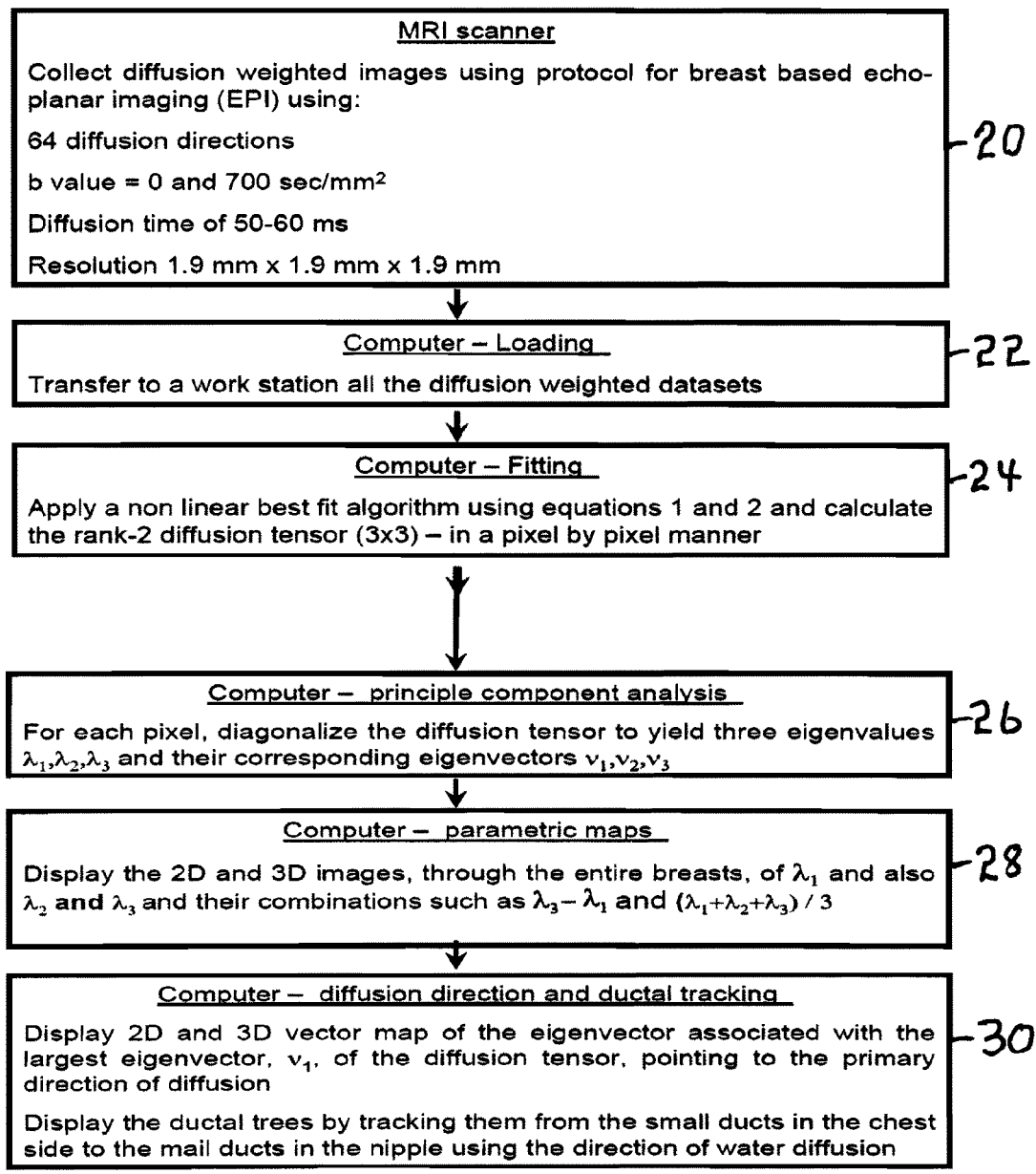
FIG. 1 shows a flow chart for DTI mammary ductal tractography of the novel method and apparatus.

A flow chart of the novel method is shown in FIG. 1. In the first step 20, diffusion weighted images are collected using a protocol for breast based echo-planar imaging (EPI) using 64 diffusion directions, b value=0 and 700 sec/mm$^2$, diffusion time of 50-60 ms and a resolution of 1.9 mm×1.9 mm×1.9 mm. The output of step 20 passes to step 22 Computer-Loading where all the diffusion weighted datasets are transferred to a work station. Next in step 24 Computer-Fitting a best fit algorithm is applied using equations 1 and 2 and the rank-2 diffusion tensor (3×3) is calculated in a pixel by pixel manner. The output of step 24 is passed to step 26 Computer-principle component analysis where for each pixel, the diffusion tensor is diagonalized to yield three eigenvalues $\lambda_1$, $\lambda_2$ and $\lambda_3$ and their corresponding eigenvectors $v_1$, $v_2$ and $v_3$. The output of step 26 is passed to step 28 Computer-parametric maps to display the 2D and 3D images, through the entire breasts, of $\lambda_1$ and also $\lambda_2$ and $\lambda_3$ and their combinations such as $\lambda_1-\lambda_3$ and $(\lambda_1+\lambda_2+\lambda_3)/3$. The output of step 28 passes to step 30 where is displayed 2D and 3D vector map of the eigenvector associated the largest eigenvector, $v_1$, of the diffusion tensor, pointing to the primary direction of diffusion, and then display the ductal trees by tracking them from the small ducts in the chest side to the mail ducts in the nipple using the direction of water diffusion. As will be evident from the above, the method is designed for optimizing diffusion weightings (b values), number of non-collinear directions for tensor calculations, diffusion, echo and repetition times, as well as spatial resolution, signal to noise, and scanning time and a sequence for fat suppression.

Image Acquisition

According to the inventive method, images can be acquired on a 3 Tesla whole body MRI scanner: MAGNETOM Trio, Tim System (Siemens, Erlangen, Germany) equipped with a transmitting body coil and a receiving, 4 channels breast array coil (Siemens) or 7 channel breast array coil (Invitro). The overall MRI protocol can include: A 3 plane localizer, axial T1 weighted images, axial T2 weighted, axial DTI with Fat-Saturation. The scanning protocol for DTI can be based on echo-planar-imaging (EPI). The method can employ a known twice refocused spin echo sequence that greatly reduces distortions due to Eddy currents. Axial images of the two breasts can be acquired simultaneously at a high spatial resolution: $2\times2\times2$ mm$^3$, or less, similar to the size of the histological specimen thickness used for modeling the ductal trees from excised breast tissues. The method tests for the optimal number of diffusion gradient directions (from 16 to 128), the number and value of diffusion sensitizing gradient strength and diffusion times: b values to be applied with the first null b value and the others ranging from 300 to 1000 sec/mm$^2$; the diffusion-time/echo-time ranges from 40 to 75/80 to 150 msec. The repetition time can also be adjusted accordingly from approximately 4 to 10 sec. The signal from the fatty tissue will be eliminated by selective fat suppression. The various known methods for suppressing the protons of fat can be tested as well. The initial fast spin echo T1 and T2 weighted protocols can be applied with the same spatial resolution as noted above. The protocols of the method are designed in such a way that the total acquisition time will not exceed 40 min.

Data Processing—1

The diffusion weighted images are loaded into a MATLAB programming environment and the diffusion tensor is calculated, pixel by pixel, by non linear fitting of the diffusion dataset to Stejskal-Tanner equation (Stejskal E O, and Tanner J E, Spin diffusion measurements: spin echoes in the presence of a time dependent field gradient, J Chem Phys 42: 288-292, 1965) using the general tensor form of the diffusion coefficient D. The fitting yields for each pixel six parameters (Dxx, Dyy, Dzz, Dxy, Dxz, and Dyz) that describe the diffusion tensor matrix per pixel. This is shown pictorially in FIG. 2 for particular datasets of an MRI resulting in 52 slices, 64 directions and DWI b=0 sec/mm$^2$ and b=700 sec/mm$^2$ with non-linear fitting. FIG. 4 shows pictorially measuring diffusion using 64 directions for both random (isotropic) and directional (anisotropic).

Then, principal component analysis (PCA) of the diffusion tensor is applied per pixel as shown pictorially in FIG. 3. PCA is a commonly used multivariate image analysis tool for analyzing dynamic images in nuclear medicine and MRI (see Jolliffe, I. T. Principal Component Analysis. Springer-Verlag, 1989). PCA of the diffusion tensor yields 3 eigenvectors $v_1$, $v_2$ and $v_3$ and their corresponding eigen-values $\lambda_1$, $\lambda_2$ and $\lambda_3$. The eigenvectors define the main three principal vectors defining the direction of the diffusion and the eigen-values define the diffusion coefficient for each eigenvector. The mean apparent diffusion coefficient (ADC) is defined as:

$$ADC=(\lambda_1+\lambda_2+\lambda_3)/3$$

The new diffusion parameters for breast cancer detection according to the present invention are:

$\lambda_1$—the eigen value of the first eigenvector in the direction of highest diffusion (the duct tube direction). This parameter is high in normal fibroglandular breast tissue and significantly lower in breast cancers.

$\lambda_3-\lambda_1$—subtraction product of the eigen value of the first eigenvector in the direction of highest diffusion from the eigen value of the 3$^{rd}$ eigenvector in the direction of the lowest diffusion. This parameter is highly negative in normal fibroglandular breast tissue approaching $0.7\times10^{-3}$ mm$^2$/sec. In breast cancers it approaches 0 mm$^2$/sec.

$v_1$—The first eigenvector pointing in a vector map in the direction of the fastest diffusion (in the direction of the ductal tube).

The degree of anisotropic water diffusion is defined as the fractional anisotropy (FA):

$$FA = \frac{\sqrt{3[(\lambda_1 - \langle\lambda\rangle)^2 + (\lambda_2 - \langle\lambda\rangle)^2 + (\lambda_3 - \langle\lambda\rangle)^2]}}{\sqrt{2(\lambda_1^2 + \lambda_2^2 + \lambda_3^2)}}$$

Where $\langle\lambda\rangle=(\lambda_1+\lambda_2+\lambda_3)/3$.

FA ranges from 0 (isotropic) to 1 (infinite anisotropy).

From preliminary results (see FIG. 8-11) it has been found that two new parameters ($\lambda_1$) and ($\lambda_3-\lambda_1$), calculated pixel by pixel, and presented as parametric images provide the best differentiation between normal and abnormal breast tissues. Other combinations of the eigenvectors and eigen-values which define various geometrical features of the diffusion may be considered and tested as part of the optimization of the processing algorithms in the course of carrying out the method aimed to achieve the highest contrast for identifying lesions using diffusion characteristics.

FIG. 6 shows in table form diffusion properties of different breast tissue. FIG. 7 shows in table form median values for all volunteers of diffusion parameters calculated for normal fibro-glandular tissue (n=17), and highlights the distinctions for the normalized standard (std/mean).

Figure 8:
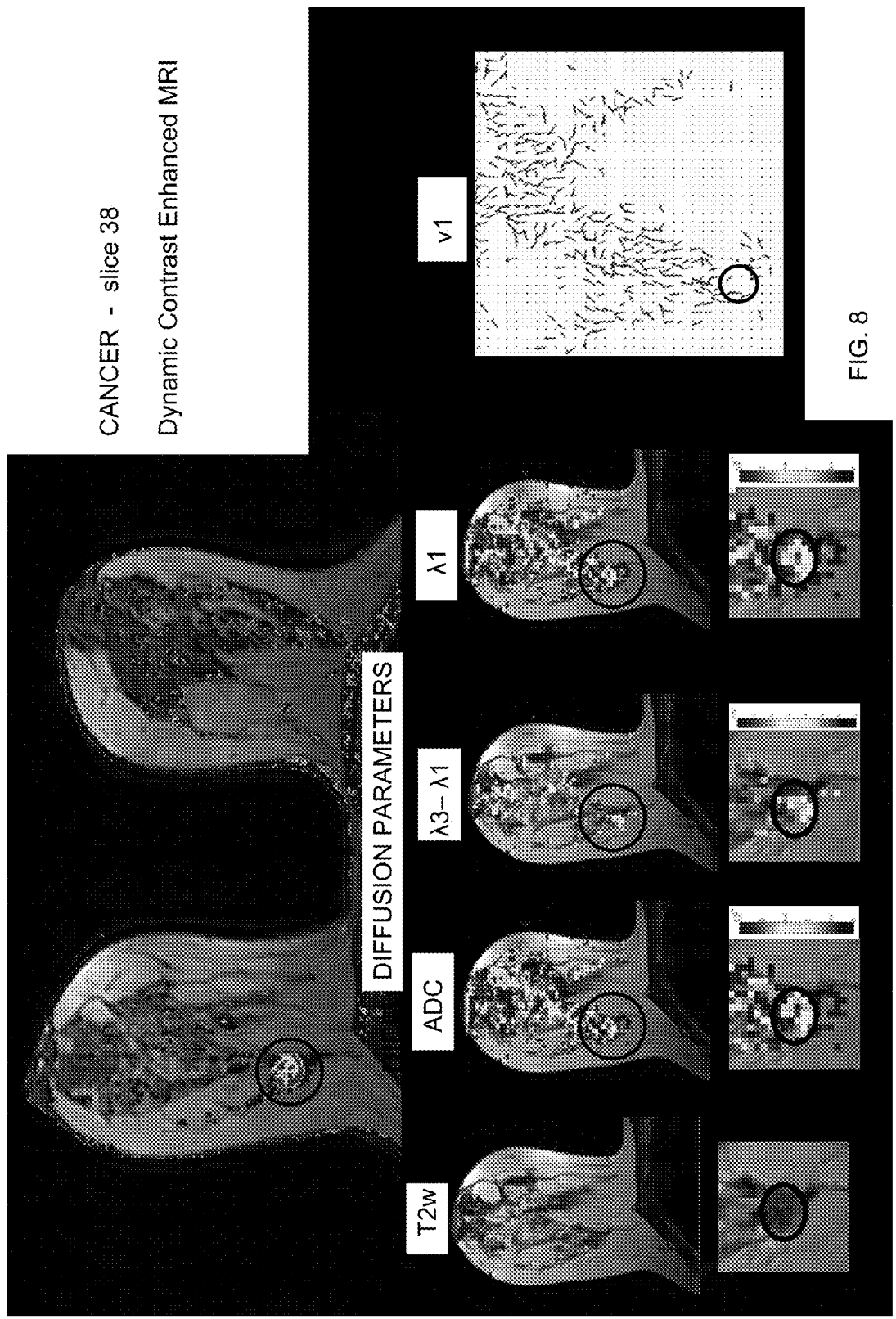
FIG. 8 shows breast images in the form of dynamic contrast enhanced MRI maps for slice 38 of the two breasts of a patient generated simultaneously and representing detected cancer mapped according to the novel diffusion parameters of the novel method and apparatus of the present invention.

FIG. 8 shows breast images in the form of dynamic contrast enhanced MRI parametric images and maps for slice 38 of the two breasts of a patient generated simultaneously and representing detected cancer mapped according to the novel diffusion parameters of the novel method and apparatus of the present invention. FIGS. 9*a* to 9*d* show the breast images of the right breast shown in FIG. 8 in enlarged views of the maps of slice 38 shown in FIG. 8. The enlarged views of FIG. 9 show pictorially and graphically parametric images of the eigenvalues $\lambda_1$, ($\lambda_3-\lambda_1$) and ADC=$(\lambda_1+\lambda_2+\lambda_3)/3$ (in units of mm$^2$/sec$\times 10^{-3}$), and the vector direction of the 1$^{st}$ eigenvector $v_1$ in axial representative slice 38 of the right breast with a breast lesion indicated by a circle. The results were obtained from analysis of a DTI dataset with 64 directions and $1.9\times1.9\times1.9$ mm$^3$ resolution over 9 minutes.

Figure 10:
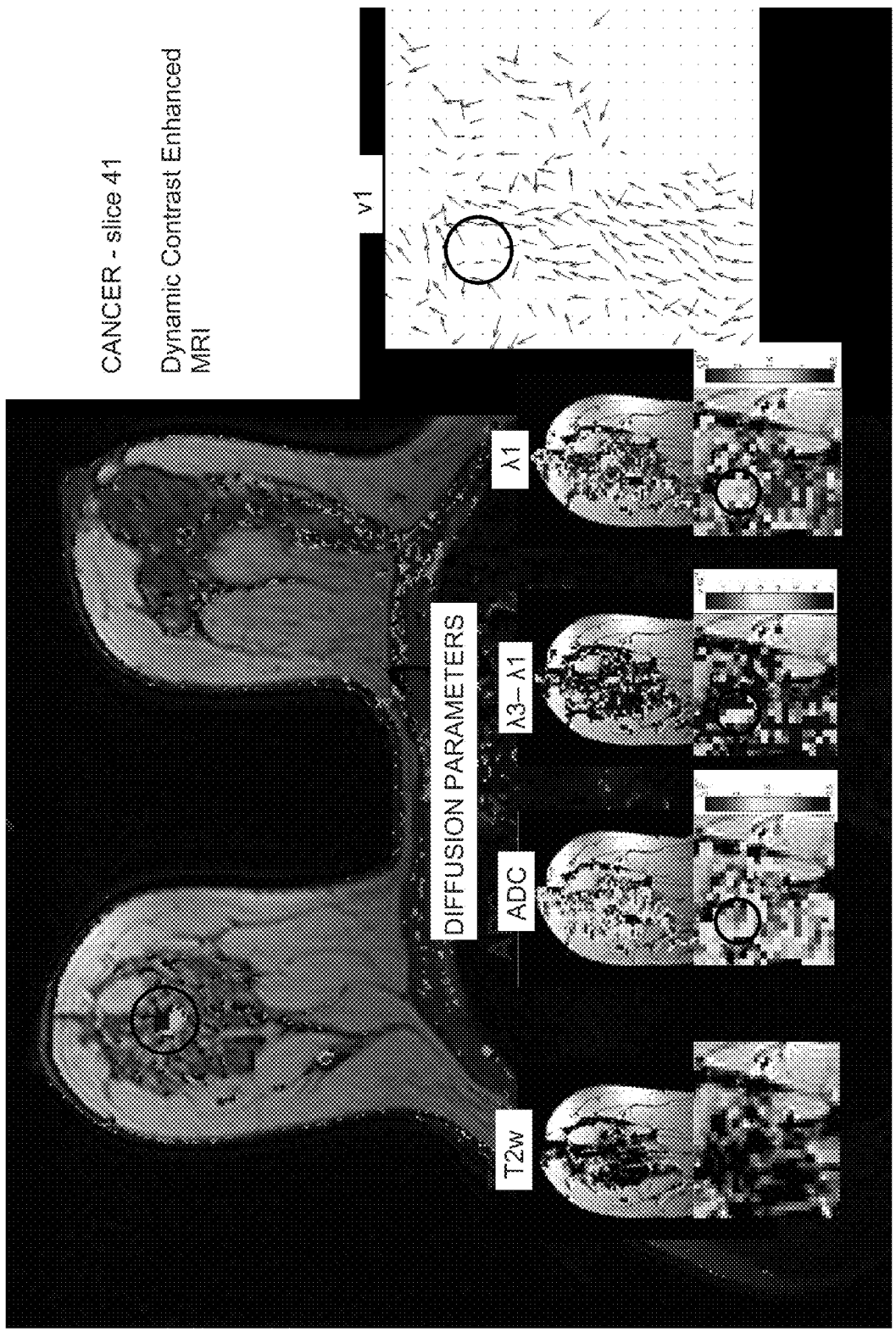
FIG. 10 shows breast images in the form of dynamic contrast enhanced MRI maps for slice 41 of the two breasts of a patient generated simultaneously and representing detected cancer mapped according to the novel diffusion parameters of the novel method and apparatus of the present invention.

FIG. 10 shows breast images in the form of dynamic contrast enhanced MRI maps for slice 41 of the two breasts of a same patient generated simultaneously and representing detected cancer mapped according to the preselected diffusion parameters of the novel method and apparatus of the present invention. In the enlarged views of FIGS. 11*a* to 11*d* the right breast of the patient is shown in the parametric images of FIG. 10 mapped according to the invention to clearly show the circled cancerous region of slice 41 shown in FIG. 10.

In a test of the new method on a single woman volunteer with confirmed breast cancer, the performance of the method and the results were able to demonstrate the ability of the various parametric images derived from processing of the DTI datasets to define the distinct diffusion features (anisotropy, direction and coefficient) of the cancer lesion as compared to the normal fibroglandular tissue as demonstrated and illustrated in FIGS. 8 to 11 (for slices 38 and 41 of the MRI datasets). The images were acquired with a 3 Tesla whole body scanner (MAGNETOM Trio, A Tim System; Siemens, Erlangen, Germany) equipped with a transmitting body coil and a receiving, 4 channels breast array coil. Sagittal breast images were acquired for a single female volunteer, with no clinical indications of any breast disease, see FIGS. 12*a* to 12*e* showing the mapped diffusion parameters of the invention.

Figure 13A:
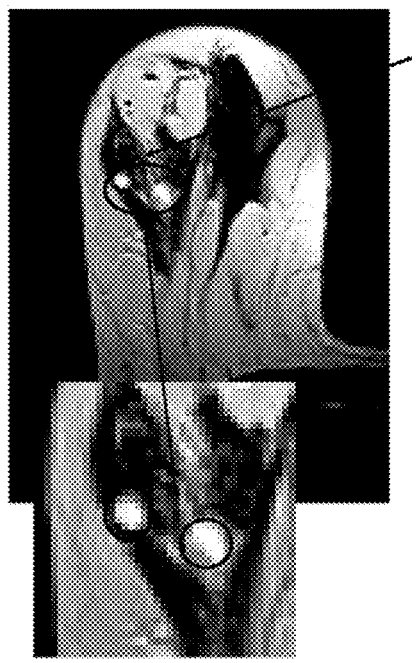
FIGS. 13a and 13b show three breast images in the form T2 weighted MRI image maps for a breast of a patient generated and representing examples of cysts in the breast tissue mapped according to the novel diffusion (DTI) parameters of the novel method and apparatus of the present invention.
Figure 13B:
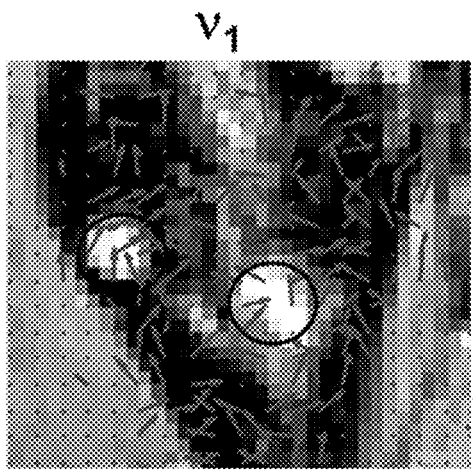
Figures 14A, 14B, 14C:
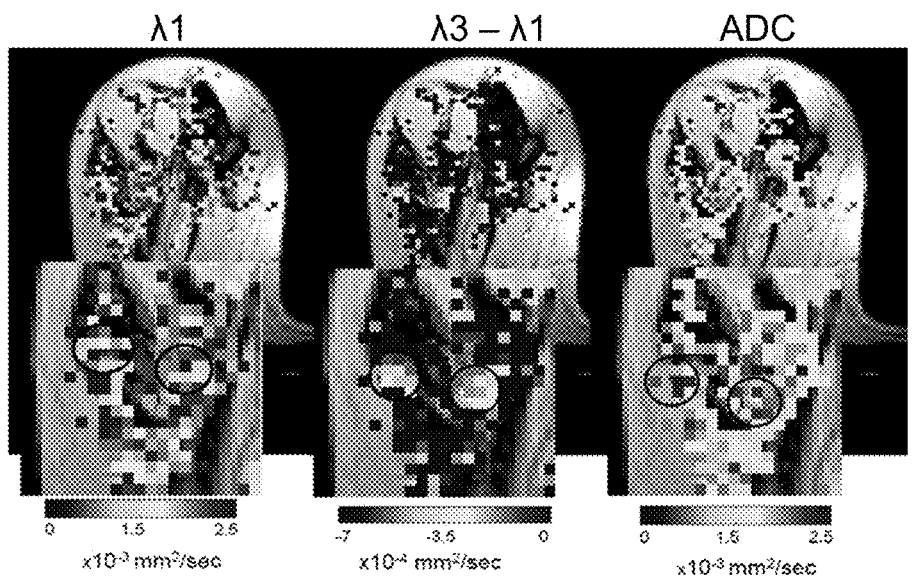
FIGS. 14a, 14b and 14c show the breast images of FIG. 14 processed to obtain dynamic contrast enhanced MRI parametric images and maps of the breast generated and mapped according to the novel diffusion (DTI) parameters of the novel method and apparatus of the present invention.

FIGS. 13a and 13b show mapped T2 weighted images which, in turn, show examples of cysts in the breast as indicated by the circles surrounding the cysts. In FIGS. 14a, 14b and 14c the DTI parameters, according to the present invention have been mapped to show in detail the manner of detection of the cysts.

Below is a detailed explanation for the diffusion data processing. Briefly, the diffusion weighted images are loaded into the MATLAB programming environment and a region of interest (ROI) consisting of the entire breast is manually delineated, based on the T2 weighted images (such ROI can be easily delineated automatically in the next phase of development). Next, the diffusion tensor is calculated per voxel by non linear fitting of the diffusion dataset to the Stejskal-Tanner equations and this tensor is diagonalized by principal component analysis (PCA) per voxel, yielding three eigen vectors and their corresponding eigen values. From the PCA results, the average apparent diffusion coefficient (ADC), fractional anisotropy (FA) and a vector field map that shows the primary diffusion direction at each location, are derived. All applications necessary for the execution were written in MATLAB programming environment and performed on a standard P4 3 GHz PC.

Exemplary Implementations

The present invention can be realized in hardware, software, or a combination of hardware and software. A system according to a preferred embodiment of the present invention can be realized in a centralized fashion in one computer system or in a distributed fashion where different elements are spread across several interconnected computer systems. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein.

An embodiment of the present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network that allow a computer system to read such computer readable information.

Figure 15:
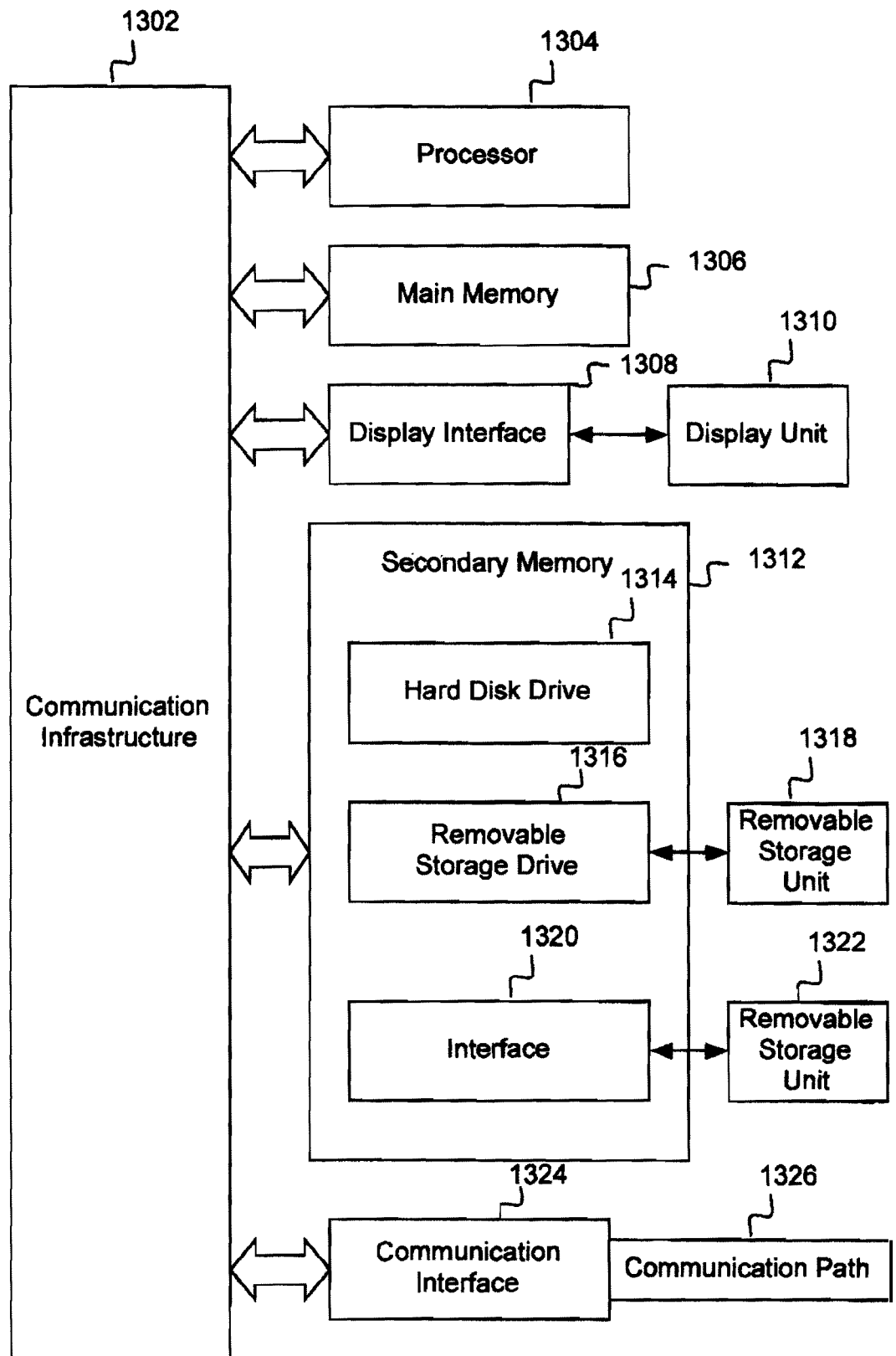
FIG. 15 is a block diagram of a computer system for implementing the method and apparatus and utilizing the product.

FIG. 15 is a block diagram of a computer system useful for implementing an embodiment of the present invention. The computer system includes one or more processors, such as processor 1304. The processor 1304 is connected to a communication infrastructure 1302 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 1308 that forwards graphics, text, and other data from the communication infrastructure 1302 (or from a frame buffer not shown) for display on the display unit 1310. The computer system also includes a main memory 1306, preferably random access memory (RAM), and may also include a secondary memory 1312. The secondary memory 1312 may include, for example, a hard disk drive 1314 and/or a removable storage drive 1316, representing a floppy disk drive, a magnetic tape drive, an optical disk drive, and more The removable storage drive 1316 reads from and/or writes to a removable storage unit 1318 in a manner well known to those having ordinary skill in the art. Removable storage unit 1318, represents a floppy disk, magnetic tape, optical disk, and more which is read by and written to by removable storage drive 1316. As will be appreciated, the removable storage unit 1318 includes a computer usable storage medium having stored therein computer software and/or data.

In alternative embodiments, the secondary memory 1312 may include other similar means for allowing computer programs or other instructions to be loaded into the computer system. Such means may include, for example, a removable storage unit 1322 and an interface 1320. Examples of such may include a program cartridge and cartridge interface (such as that found in video game devices), a removable memory chip (such as an EPROM, or PROM) and associated socket, and other removable storage units 1322 and interfaces 1320 which allow software and data to be transferred from the removable storage unit 1322 to the computer system.

The computer system may also include a communications interface 1324. Communications interface 1324 allows software and data to be transferred between the computer system and external devices. Examples of communications interface 1324 may include a modem, a network interface (such as an Ethernet card), a communications port, a PCMCIA slot and card, and more Software and data transferred via communications interface 1324 are in the form of signals which may be, for example, electronic, electromagnetic, optical, or other signals capable of being received by communications interface 1324. These signals are provided to communications interface 1324 via a communications path (i.e., channel) 1326. This channel 1326 carries signals and may be implemented using wire or cable, fiber optics, a phone line, a cellular phone link, an RF link, and/or other communications channels. In this document, the terms "computer program medium," "computer usable medium," and "computer readable medium" are used to generally refer to media such as main memory 1306 and secondary memory 1312, removable storage drive 1316, a hard disk installed in hard disk drive 1314, and signals. These computer program products are means for providing software to the computer system. The computer readable medium allows the computer system to read data, instructions, messages or message packets, and other computer readable information from the computer readable medium. The computer readable medium, for example, may include non-volatile memory, such as Floppy, ROM, Flash memory, Disk drive memory, CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information. Computer programs (also called computer control logic) are stored in main memory 1306 and/or secondary memory 1312. Computer programs may also be received via communications interface 1324. Such computer programs, when executed, enable the computer system to perform the features of the present invention as discussed herein. In particular, the computer programs, when executed, enable the processor 1304 to perform the features of the computer system. Accordingly, such computer programs represent controllers of the computer system.

Although the invention is shown and described in terms of preferred embodiments, changes and modifications can be made without departing from the teachings and inventive concepts herein. Such changes and modifications are deemed to fall within the purview of the invention as recited in the appended claims.

What is claimed is:

1. A method for imaging a human breast to map the breast ductal tree comprising the steps of:
    a) diffusion tensor imaging of a breast with high spatial resolution;
    b) tracking the breast ductal tree using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression;
    c) calculating the diffusion tensor by a non-linear best fit algorithm;
    d) diagonalizing with principal component analysis to three eigenvectors and their corresponding eigen values;
    e) obtaining a vector field map for tracking of breast ducts of the ductal trees along the direction of the $1^{st}$ eigenvector $v_1$ and
    f) displaying the ductal tree on a voxel by voxel basis in parametric images using color coding and vector pointing.

2. The method of claim 1 wherein the human's two breasts are imaged simultaneously.

3. The method of claim 1 wherein the imaging also utilizes as a diffusion parameter for detection of breast cancer at least one of the eigen values $\lambda_1$ and $(\lambda_3-\lambda_1)$.

4. The method of claim 3, wherein the imaging also utilizes as a diffusion parameter for detection of breast cancer the eigen value Apparent Diffusion Coefficient=$(\lambda_1+\lambda_2+\lambda_3)/3$ (in units of (mm$^2$/sec×10$^{-3}$).

5. Apparatus for imaging a human breast to map the breast ductal tree comprising:
    a) means for diffusion tensor imaging of a breast with high spatial resolution;
    b) means for tracking the breast ductal tree using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression;
    c) means for calculating the diffusion tensor by a non-linear best fit algorithm;
    d) means for diagonalizing with principal component analysis to three eigenvectors and their corresponding eigen values;
    e) means for obtaining a vector field map for tracking of breast ducts of the ductal trees along the direction of the $1^{st}$ eigenvector $v_1$; and
    f) means for displaying the ductal tree on a voxel by voxel basis in parametric images using color coding and vector pointing.

6. The apparatus of claim 5 wherein means are provided to image simultaneously the human's two breasts.

7. The apparatus of claim 5 wherein means are provided to carry out the imaging also utilizing as a diffusion parameter for detection of breast cancer at least one of the eigenvalues $\lambda_1$ and $(\lambda_3-\lambda_1)$.

8. The apparatus of claim 7 wherein said means provided to carry out the imaging also utilizes as a diffusion parameter for detection of breast cancer the eigen value Apparent Diffusion Coefficient=$(\lambda_1+\lambda_2+\lambda_3)/3$ (in units of (mm$^2$/sec×−3).

9. A computer product comprising:
    a computer readable medium stored on non-transitory media and containing programmed instructions for—
        obtaining diffusion tensor imaging of a breast with high spatial resolution to map the breast ductal tree;
        tracking the breast ductal tree using a protocol for breast based on echo-planar imaging (EPI) diffusion designed for optimizing diffusion weightings (b values), number of non-collinear directions for tensor calculations, diffusion, echo and repetition times, spatial resolution, signal to noise, scanning time and a sequence for fat suppression;
        calculating the diffusion tensor by a non-linear best fit algorithm;
        diagonalizing with principal component analysis to three eigenvectors and their corresponding eigen values; and
        displaying the ductal tree on a voxel by voxel basis in parametric images using color coding and vector pointing.

10. The computer product of claim 9 further comprising the computer readable medium containing programmed instructions for simultaneously imaging the human's two breasts.

11. The computer product of claim 9 further comprising the computer readable medium containing programmed instructions for imaging also utilizing as a diffusion parameter for detection of breast cancer at least one of the eigen values $\lambda_1$ and $(\lambda_3\lambda_1)$.

12. The computer product of claim 11 further comprising the computer readable medium containing programmed instructions for imaging also utilizing as a diffusion parameter for detection of breast cancer the eigen value Apparent Diffusion Coefficient=$(\lambda_1+\lambda_2+\lambda_3)/3$ (in units of (mm$^2$/sec×10$^{-3}$).

13. A method for imaging the human breast comprising the steps of:
    a) obtaining by high spatial resolution diffusion tensor imaging of a breast or breasts to map breast ductal trees;
    b) tracking breast ductal trees via a first set of algorithms using a protocol for breast based on echo-planar imaging (EPI) diffusion designed for optimizing diffusion weightings (b values), number of non-collinear directions for tensor calculations, diffusion, echo and repetition times, as well as spatial resolution, signal to noise, and scanning time and a sequence for fat suppression;
    c) calculating the diffusion tensor by a non linear best fit algorithm;
    d) diagonalizing with principal component analysis or equivalent algorithm this tensor to three eigenvectors and their corresponding eigen values with a first set of algorithms e) deriving from the eigen values characteristic parameters including, Apparent Diffusion Coefficients and the diffusion anisotropy indices using a dedicated set of algorithms;

f) using a specific set of algorithm for deriving a vector field map for tracking of breast ducts along the direction of the eigenvector with the largest eigen value representing the largest diffusion; and g) displaying the ductal tree on a voxel by voxel basis using color coding and vector pointing.

14. An apparatus for imaging the human breast comprising:
a) means for obtaining by high spatial resolution diffusion tensor imaging of a breast or breasts to map breast ductal trees;
b) means for tracking breast ductal trees via a first set of algorithms using a protocol for breast echo-planar imaging (EPI) diffusion designed for optimizing diffusion weightings (b values), number of non-collinear directions for tensor calculations, diffusion, echo and repetition times, as well as spatial resolution, signal to noise, and scanning time and fat suppression sequence;
c) means for calculating the diffusion tensor using a second set of algorithms;
d) means for using principal component analysis to diagonalize the diffusion tensor and obtain three eigenvectors and their corresponding eigen values;
e) means deriving characteristic parameters including, Apparent Diffusion Coefficients and the diffusion anisotropy indices;
f) means for determining the direction of the principal eigen-vector with largest eigen value presenting the direction of greatest diffusion;
g) means for deriving a vector field map for tracking of breast ducts along the direction of greatest diffusion; and
h) means for displaying the ductal tree on a voxel by voxel basis using color coding and vector pointing.

15. A product comprising:
a computer readable medium stored on non-transitory media and containing programmed instructions for—
obtaining by high spatial resolution diffusion tensor imaging of breasts to map the breast ductal trees;
tracking the breast ductal trees via a first set of algorithms using a protocol for breast echo-planar imaging (EPI) diffusion designed for optimizing diffusion weightings (b values), number of non-collinear directions for tensor calculations, diffusion, echo and repetition times, as well as spatial resolution, signal to noise, and scanning time and fat suppression sequence;
calculating the diffusion tensor using non linear best fit algorithms;
applying principal component analysis to diagonalize the diffusion tensor and obtain three eigenvectors and their corresponding eigen values to derive characteristic parameters including, Apparent Diffusion Coefficients and the diffusion anisotropy indices;
deriving a vector field map for tracking of breast ducts along the direction of the principal eigenvector representing greatest diffusion; and
displaying the ductal trees on a voxel by voxel basis using color coding and vector pointing.

16. The product of claim 15, further including programmed instructions for calculating the fractional anisotropy as an indicator of malignant growth.

17. The product of claim 15, wherein the diffusion anisotropy indices are calculated using fractional anisotropy.

18. The product of claim 15, wherein lesions in the breast are detected using the obtained eigen values, ADC, and diffusion anisotropy indices.

* * * * *